United States Patent
Kreifels

(10) Patent No.: US 11,442,807 B2
(45) Date of Patent: *Sep. 13, 2022

(54) ERROR CORRECTION CODE (ECC) OPERATIONS IN MEMORY

(71) Applicant: Micron Technology, Inc., Boise, ID (US)

(72) Inventor: Gerard A. Kreifels, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/157,001

(22) Filed: Jan. 25, 2021

(65) Prior Publication Data

US 2021/0141690 A1 May 13, 2021

Related U.S. Application Data

(63) Continuation of application No. 16/219,143, filed on Dec. 13, 2018, now Pat. No. 10,901,837, which is a
(Continued)

(51) Int. Cl.
*G06F 11/10* (2006.01)
*H03M 13/29* (2006.01)
(Continued)

(52) U.S. Cl.
CPC ......... *G06F 11/1048* (2013.01); *H03M 13/19* (2013.01); *H03M 13/2942* (2013.01);
(Continued)

(58) Field of Classification Search
CPC ........... G06F 11/1048; G06F 11/1044; H03M 13/19; H03M 13/2942; H03M 13/618;
(Continued)

(56) References Cited

U.S. PATENT DOCUMENTS 3,648,239 A  3/1972  Carter et al.
4,241,446 A  12/1980  Trubisky
(Continued)

FOREIGN PATENT DOCUMENTS

JP    5117593 B2    1/2013

OTHER PUBLICATIONS

International Search Report and Written Opinion from related international application No. PCT/US2017/025688, dated Jun. 29, 2017, 15 pp.
(Continued)

*Primary Examiner* — James C Kerveros
(74) *Attorney, Agent, or Firm* — Brooks, Cameron & Huebsch PLLC

(57) ABSTRACT

The present disclosure includes apparatuses and methods for ECC operation associated with memory. One example apparatus comprises a controller configured to perform an error correction code (ECC) operation on a codeword stored in the memory, wherein the codeword includes a first number of ECC bits and the first number of ECC bits are generated based on an encoding matrix, wherein each row of the encoding matrix has an odd number of bits having a binary value of 1.

20 Claims, 5 Drawing Sheets

Related U.S. Application Data continuation of application No. 15/091,112, filed on Apr. 5, 2016, now Pat. No. 10,176,040.

(51) Int. Cl.
*H03M 13/19* (2006.01)
*H03M 13/00* (2006.01)
*H03M 13/15* (2006.01)
*H03M 13/09* (2006.01)

(52) U.S. Cl.
CPC .......... *H03M 13/618* (2013.01); *H03M 13/09* (2013.01); *H03M 13/152* (2013.01); *H03M 13/1575* (2013.01)

(58) Field of Classification Search
CPC . H03M 13/09; H03M 13/152; H03M 13/1575
USPC ........................................................ 714/764
See application file for complete search history.

(56) References Cited

U.S. PATENT DOCUMENTS

| | | | |
|---|---|---|---|
| 5,917,838 A | 6/1999 | Wardrop | |
| 7,100,097 B2 | 8/2006 | Patella et al. | |
| 7,193,798 B2 | 3/2007 | Byrd et al. | |
| 8,065,598 B1 | 11/2011 | Gunnam | |
| 8,560,927 B1 | 10/2013 | Pagiamtzis et al. | |
| 8,745,472 B2 | 6/2014 | Goel et al. | |
| 9,311,181 B2 | 4/2016 | Lee et al. | |
| 2005/0182997 A1 | 8/2005 | Kushida et al. | |
| 2005/0251730 A1 | 11/2005 | Classon | |
| 2006/0020873 A1 | 1/2006 | Deolalikar | |
| 2007/0011598 A1 | 1/2007 | Hassner et al. | |
| 2007/0283229 A1* | 12/2007 | Dell | H03M 13/13 714/777 |
| 2009/0164863 A1 | 6/2009 | Oh | |
| 2009/0313520 A1 | 12/2009 | Chung | |
| 2012/0274487 A1 | 11/2012 | Kondo | |
| 2013/0283123 A1 | 10/2013 | Gara et al. | |
| 2014/0068391 A1 | 3/2014 | Goel et al. | |
| 2015/0082113 A1 | 3/2015 | Myun | |
| 2015/0089321 A1 | 3/2015 | Myung | |
| 2015/0161002 A1 | 6/2015 | Chiang | |
| 2016/0056842 A1 | 2/2016 | Linstadt et al. | |
| 2018/0152204 A1* | 5/2018 | Halbawi | H03M 13/3761 |

OTHER PUBLICATIONS

Office Action from related Taiwanese patent application No. 106111421, dated Nov. 20, 2017, 13 pp.

Preliminary Rejection from related Korean Patent Application No. 10-2018-7031675, dated Dec. 18, 2019, 13 pages.

\* cited by examiner

| | | |
|---|---|---|
| DATA PATTERN 0 | 0 0 0 0 0 0 0 0 0 1 | ⎫ |
| DATA PATTERN 1 | 0 0 0 0 0 0 0 0 1 0 | |
| DATA PATTERN 2 | 0 0 0 0 0 0 0 1 0 0 | |
| DATA PATTERN 3 | 0 0 0 0 0 0 1 0 0 0 | |
| DATA PATTERN 4 | 0 0 0 0 0 1 0 0 0 0 | ⎬ 351 |
| DATA PATTERN 5 | 0 0 0 0 1 0 0 0 0 0 | |
| DATA PATTERN 6 | 0 0 0 1 0 0 0 0 0 0 | |
| DATA PATTERN 7 | 0 0 1 0 0 0 0 0 0 0 | |
| DATA PATTERN 8 | 0 1 0 0 0 0 0 0 0 0 | |
| DATA PATTERN 9 | 1 0 0 0 0 0 0 0 0 0 | ⎭ |
| DATA PATTERN 10 | 0 0 0 0 0 0 0 1 1 1 | ⎫ |
| DATA PATTERN 11 | 0 0 0 0 0 0 1 1 1 0 | |
| DATA PATTERN 12 | 0 0 0 0 0 1 1 1 0 0 | |
| DATA PATTERN 13 | 0 0 0 0 1 1 1 0 0 0 | |
| DATA PATTERN 14 | 0 0 0 1 1 1 0 0 0 0 | |
| DATA PATTERN 15 | 0 0 1 1 1 0 0 0 0 0 | |
| DATA PATTERN 16 | 0 1 1 1 0 0 0 0 0 0 | |
| DATA PATTERN 17 | 1 0 0 0 0 0 0 0 1 1 | ⎬ 353 |
| DATA PATTERN 18 | 1 1 0 0 0 0 0 0 0 1 | |
| DATA PATTERN 19 | 1 1 1 0 0 0 0 0 0 0 | |
| DATA PATTERN 20 | 0 0 0 0 0 0 1 0 1 1 | |
| DATA PATTERN 21 | 0 0 0 0 0 1 0 1 1 0 | |
| ⋮ | | ⎭ |
| DATA PATTERN 130 | 0 0 0 0 0 1 1 1 1 1 | ⎫ |
| DATA PATTERN 131 | 0 0 0 0 1 1 1 1 1 0 | |
| DATA PATTERN 132 | 0 0 0 1 1 1 1 1 0 0 | |
| DATA PATTERN 133 | 0 0 1 1 1 1 1 0 0 0 | |
| DATA PATTERN 134 | 0 1 1 1 1 1 0 0 0 0 | |
| DATA PATTERN 135 | 1 0 0 0 0 0 1 1 1 1 | |
| DATA PATTERN 136 | 1 1 0 0 0 0 0 1 1 1 | ⎬ 355-1 |
| DATA PATTERN 137 | 1 1 1 0 0 0 0 0 1 1 | |
| DATA PATTERN 138 | 1 1 1 1 0 0 0 0 0 1 | |
| DATA PATTERN 139 | 1 1 1 1 1 0 0 0 0 0 | |
| ⋮ | | ⎭ |
| DATA PATTERN 380 | 0 1 0 1 0 1 0 1 0 1 | ⎫ 355-2 |
| DATA PATTERN 381 | 1 0 1 0 1 0 1 0 1 0 | ⎭ |

*Fig. 3A*

```
DATA PATTERN 0      0 0 0 0 0 0 0 0 0 1
DATA PATTERN 1      0 0 0 0 0 0 0 0 1 0
DATA PATTERN 2      0 0 0 0 0 0 0 1 0 0
DATA PATTERN 3      0 0 0 0 0 0 1 0 0 0
DATA PATTERN 4      0 0 0 0 0 1 0 0 0 0         ⎫
DATA PATTERN 5      0 0 0 0 1 0 0 0 0 0         ⎬ 352
DATA PATTERN 6      0 0 0 1 0 0 0 0 0 0         ⎭
DATA PATTERN 7      0 0 1 0 0 0 0 0 0 0
DATA PATTERN 8      0 1 0 0 0 0 0 0 0 0
DATA PATTERN 9      1 0 0 0 0 0 0 0 0 0
DATA PATTERN 10     0 0 0 0 0 0 0 1 1 1
DATA PATTERN 11     0 0 0 0 0 0 1 1 1 0
DATA PATTERN 12     0 0 0 0 0 1 1 1 0 0
DATA PATTERN 13     0 0 0 0 1 1 1 0 0 0
DATA PATTERN 14     0 0 0 1 1 1 0 0 0 0
DATA PATTERN 15     0 0 1 1 1 0 0 0 0 0
DATA PATTERN 16     0 1 1 1 0 0 0 0 0 0         ⎫
DATA PATTERN 17     1 0 0 0 0 0 0 0 1 1         ⎬ 354
DATA PATTERN 18     1 1 0 0 0 0 0 0 0 1
DATA PATTERN 19     1 1 1 0 0 0 0 0 0 0
DATA PATTERN 20     0 0 0 0 0 0 1 0 1 1
DATA PATTERN 21     0 0 0 0 0 1 0 1 1 0
                    •
                    •
                    •
        DATA PATTERN 130     0 0 0 0 0 1 1 1 1 1
357 — ̶D̶A̶T̶A̶ ̶P̶A̶T̶T̶E̶R̶N̶ ̶1̶3̶1̶   ̶0̶ ̶0̶ ̶0̶ ̶0̶ ̶1̶ ̶1̶ ̶1̶ ̶1̶ ̶1̶ ̶0̶
        DATA PATTERN 132     0 0 0 1 1 1 1 1 0 0 — 354
357 — ̶D̶A̶T̶A̶ ̶P̶A̶T̶T̶E̶R̶N̶ ̶1̶3̶3̶   ̶0̶ ̶0̶ ̶1̶ ̶1̶ ̶1̶ ̶1̶ ̶1̶ ̶0̶ ̶0̶ ̶0̶
        DATA PATTERN 134     0 1 1 1 1 1 0 0 0 0 — 354
357 — ̶D̶A̶T̶A̶ ̶P̶A̶T̶T̶E̶R̶N̶ ̶1̶3̶5̶   ̶1̶ ̶0̶ ̶0̶ ̶0̶ ̶0̶ ̶1̶ ̶1̶ ̶1̶ ̶1̶ ̶1̶
        DATA PATTERN 136     1 1 0 0 0 0 0 1 1 1 — 354
357 — ̶D̶A̶T̶A̶ ̶P̶A̶T̶T̶E̶R̶N̶ ̶1̶3̶7̶   ̶1̶ ̶1̶ ̶1̶ ̶0̶ ̶0̶ ̶0̶ ̶0̶ ̶0̶ ̶1̶ ̶1̶
        DATA PATTERN 138     1 1 1 1 0 0 0 0 0 1 — 354
357 — ̶D̶A̶T̶A̶ ̶P̶A̶T̶T̶E̶R̶N̶ ̶1̶3̶9̶   ̶1̶ ̶1̶ ̶1̶ ̶1̶ ̶1̶ ̶0̶ ̶0̶ ̶0̶ ̶0̶ ̶0̶
                    •
                    •
                    •
DATA PATTERN 260    0 0 0 1 1 1 0 1 0 1
DATA PATTERN 261    0 0 1 1 1 0 1 0 1 0
DATA PATTERN 262    0 1 0 0 0 1 1 1 0 1
DATA PATTERN 263    0 1 0 1 0 0 0 1 1 1         ⎫
DATA PATTERN 264    0 1 1 1 0 1 0 1 0 0         ⎬ 354
DATA PATTERN 265    1 0 0 0 1 1 1 0 1 0
DATA PATTERN 266    1 0 1 0 0 0 1 1 1 0
DATA PATTERN 267    1 0 1 0 1 0 0 0 1 1
DATA PATTERN 268    1 1 0 1 0 1 0 0 0 1
DATA PATTERN 269    1 1 1 0 1 0 1 0 0 0
                    •
                    •
                    •
DATA PATTERN 380    0 1 0 1 0 1 0 1 0 1 — 354
DATA PATTERN 381    1 0 1 0 1 0 1 0 1 0
```

*Fig. 3B*

ERROR CORRECTION CODE (ECC) OPERATIONS IN MEMORY

PRIORITY INFORMATION

This application is a Continuation of U.S. application Ser. No. 16/219,143, filed on Dec. 13, 2018, which is a Continuation of U.S. application Ser. No. 15/091,112, filed Apr. 5, 2016, and issued as U.S. Pat. No. 10,176,040 on Jan. 8, 2019, the contents of which are incorporated herein by reference.

TECHNICAL FIELD

The present disclosure relates generally to semiconductor memory apparatuses and methods, and more particularly, error correction code (ECC) operations associated with memory.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can retain stored data when not powered and can include NAND flash memory, NOR flash memory, phase change random access memory (PCRAM), resistive random access memory (RRAM), and magnetic random access memory (MRAM), among others.

Memory devices can be combined together to form a solid state drive (SSD). An SSD can include non-volatile memory (e.g., NAND flash memory and/or NOR flash memory), and/or can include volatile memory (e.g., DRAM and/or SRAM), among various other types of non-volatile and volatile memory. Flash memory devices can include memory cells storing data in a charge storage structure such as a floating gate, for instance, and may be utilized as non-volatile memory for a wide range of electronic applications. Flash memory devices typically use a one-transistor memory cell that allows for high memory densities, high reliability, and low power consumption, relative to various other memory devices.

Memory is utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

A state of a memory cell can be determined by sensing the stored charge on the charge storage structure (e.g., the Vt) of the cell. However, a number of mechanisms, such as read disturb, program disturb, cell-to-cell interference, and/or charge loss (e.g., charge leakage), for example, can cause the Vt of the memory cell to change. Error correction code (ECC) schemes, such as a Hamming code, have been used to correct bit errors. The Hamming code with a Hamming distance H can correct and/or detect a certain number of errors. For example, the certain number of errors that can be corrected and/or detected with the Hamming distance H can be defined by a following equation:

$$H-1 \geq 2C+D$$

wherein, H represents the Hamming distance, and C and D respectively represents a number of errors that can be corrected and detected. For example, a Hamming code (265, 9, 3) with 265-bit codeword including 9 ECC bits and a Hamming distance of 3 can either only correct one error or only detect two errors without any correction.

BRIEF DESCRIPTION OF THE DRAWINGS

FIGS. 3A and 3B illustrate a number of data patterns associated with encoding a binary data word in accordance with a number of embodiments of the present disclosure.

DETAILED DESCRIPTION

Figure 1:
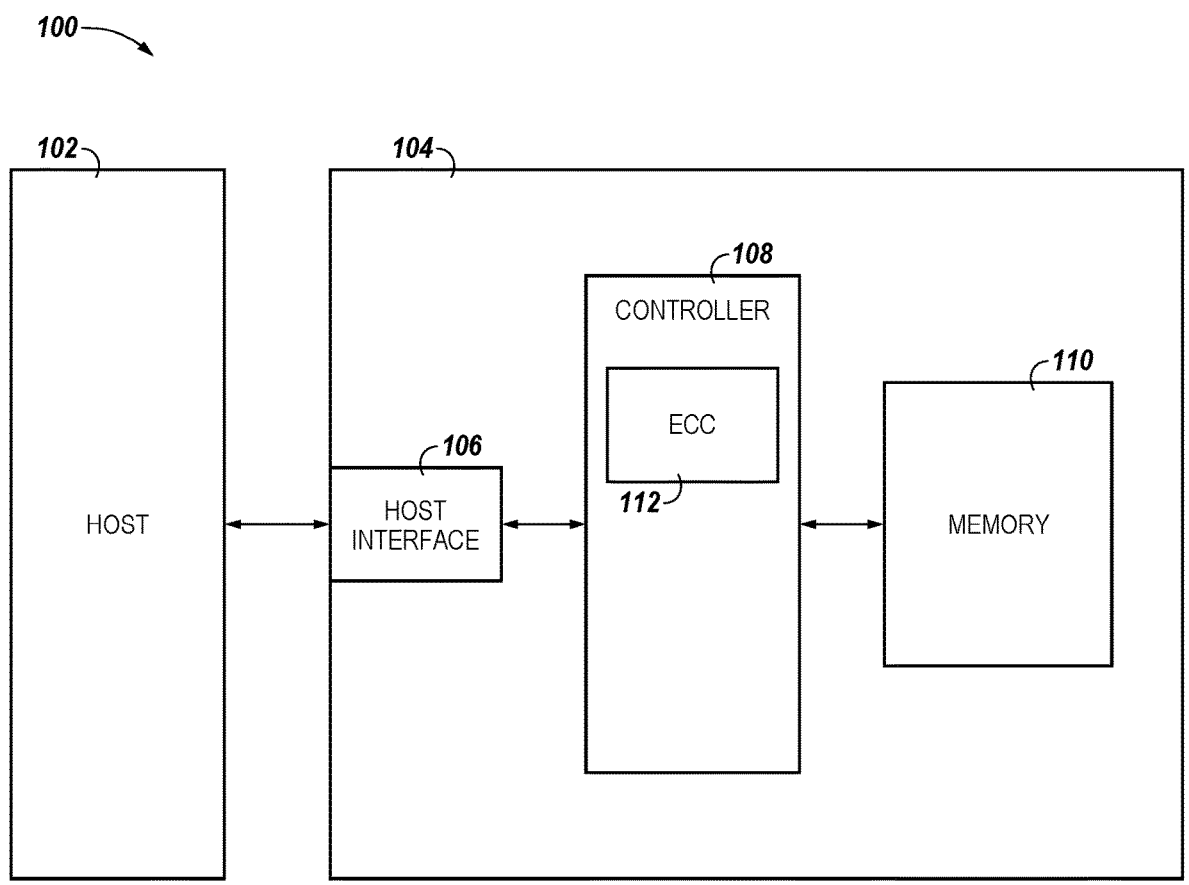
FIG. 1 is a block diagram of an apparatus in the form of a computing system including a memory system in accordance with a number of embodiments of the present disclosure.

The present disclosure includes apparatuses and methods for ECC operations associated with memory. One example apparatus comprises a controller configured to perform an error correction code (ECC) operation on a codeword stored in the memory, wherein the codeword includes a first number of ECC bits and the first number of ECC bits are generated based on an encoding matrix, wherein each row of the encoding matrix has an odd number of bits having a binary value of 1.

Embodiments of the present disclosure can include protecting both ECC bits and user data with a same number of parity bits as existing Hamming code schemes. As an example, a number of Hamming codes with an extra parity bit whose ability to detect and correct is limited to a particular circumstance where a single bit error or two bit errors occurred in a protected location (e.g., either ECC bits or the binary data word). Such limited ability may result in erroneous error correction operations when a single bit error or any one of two bit errors occurs in an unprotected location. For instance, previous approaches used a Hamming code (265, 256, 3) to correct a single bit error without an ability to detect two bit errors and an extended Hamming code (266, 256, 3) with an extra parity bit to detect two bit errors with an ability to correct a single bit error. However, such previous approaches have a limited error correction capability. For instance, if an extra parity bit is added to data before generating ECC bits, the ECC bits are not protected by the parity bit and if an extra parity is added after generating ECC bits, the parity bit is unprotected. For example, a single bit error at an unprotected location can result in an erroneous error correction operation, which can lead to loss of data.

A number of embodiments of the present disclosure can protect both ECC bits and data (e.g., user data read from a host) such that any single bit error or two bit errors in any location within the ECC bits or the data can be corrected or detected. For example, a Hamming code (266, 10, 4) is derived from the Hamming code (265, 9, 3) by adding one additional ECC bit to the Hamming code (265, 9, 3) to be capable of having the Hamming distance of 4. The Hamming code (266, 10, 4) can either detect and correct a single bit error and detect an additional error, or detect three errors without correction. Protecting both ECC bits and the data can provide benefits such as increasing the performance, reliability, and/or lifetime of the memory, among other benefits. For example, a bit error rate (BER) of portions of a memory (e.g., pages, blocks, etc.) may be increased when a single bit error or two bit errors in an unprotected location leads to additional incorrect error correction operations. However, embodiments of the present disclosure may increase the reliability by correctly determining what to do with a single bit error or two bit errors, which can lead to an error correction operation without injecting more errors. A number of embodiments of the present disclosure also can prolong the lifetime of the memory by reducing likelihood of injecting more errors due to incorrect error correction operations.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "M" and "N", particularly with respect to reference numerals in the drawings, indicates that a number of the particular feature so designated can be included. As used herein, "a number of" a particular thing can refer to one or more of such things (e.g., a number of memory devices can refer to one or more memory devices).

The figures herein follow a numbering convention in which the first digit or digits correspond to the drawing figure number and the remaining digits identify an element or component in the drawing. Similar elements or components between different figures may be identified by the use of similar digits. For example, 110 may reference element "10" in FIG. 1, and a similar element may be referenced as 210 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including a memory system 104 in accordance with a number of embodiments of the present disclosure.

As used herein, a memory system 104, a controller 108, or a memory device 110 might also be separately considered an "apparatus." The memory system 104 can be a solid state drive (SSD), for instance, and can include a host interface 106, a controller 108 (e.g., a sequencer and/or other control circuitry), and a number of memory devices 110, which can be referred to as memory 110. The memory 110 can comprise, for instance, a number of solid state memory devices such as NAND flash devices, which provide a storage volume for the memory system 104.

The controller 108 can be coupled to the host interface 106 and to the memory 110 via a plurality of channels and can be used to transfer data between the memory system 104 and a host 102. The interface 106 can be in the form of a standardized interface. For example, when the memory system 104 is used for data storage in a computing system 100, the interface 106 can be a serial advanced technology attachment (SATA), peripheral component interconnect express (PCIe), or a universal serial bus (USB), among other connectors and interfaces. In general, however, interface 106 can provide an interface for passing control, address, data, and other signals between the memory system 104 and a host 102 having compatible receptors for the interface 106.

Host 102 can be a host system such as a personal laptop computer, a desktop computer, a digital camera, a mobile telephone, or a memory card reader, among various other types of hosts. Host 102 can include a system motherboard and/or backplane and can include a number of memory access devices (e.g., a number of processors). Host 102 can also be a memory controller, such as where memory system 104 is a memory device (e.g., a memory device having an on-die controller).

The controller 108 can communicate with the memory 110 (which in some embodiments can be a number of memory arrays on a single die) to control data read, write, and erase operations, among other operations. As an example, the controller 108 can be on a same die or a different die than a die or dice corresponding to memory 110.

Although not specifically illustrated, the controller 108 can include a discrete memory channel controller for each channel coupling the controller 108 to the memory 110. The controller 108 can include, for example, a number of components in the form of hardware and/or firmware (e.g., one or more integrated circuits) and/or software for controlling access to the memory 110 and/or for facilitating data transfer between the host 102 and memory 110.

As illustrated in FIG. 1, the controller 108 can include an error correction component 112 (shown as "ECC"). The error correction component 112 can include Hamming code error correction circuitry to correct a single bit error and detect two bit errors. The ECC component 112 is not limited to circuitry (e.g., hardware) implementations. For instance, the ECC component 112 can be implemented in hardware, firmware, and/or software. Although referred to as an error correction component, ECC component 112 can be used to detect, as well as to correct, data errors. Additionally, ECC component 112 can include error encoding and decoding functionality as described further below. For example, in a number of embodiments, the ECC component 112 can encode a combined amount of user data and ECC data to be written to memory 110.

The ECC component 112 can be discrete components such as an application specific integrated circuit (ASIC) or the components may reflect functionally provided by circuitry within the controller 108 that does not necessarily have a discrete physical form separate from other portions of the controller 108. Although illustrated as components within the controller 108 in FIG. 1, the ECC component 112 can be external to the controller 108 or can have a number of components located within the controller 108 and a number of components located external to the controller 108. The ECC component 112 can include separate encoding and decoding components, in a number of embodiments.

The memory 110 can include a number of arrays of memory cells (e.g., non-volatile memory cells). The arrays can be flash arrays with a NAND architecture, for example.

However, embodiments are not limited to a particular type of memory array or array architecture. Although floating-gate type flash memory cells in a NAND architecture are generally referred to herein, embodiments are not so limited. The memory cells can be grouped, for instance, into a number of blocks including a number of physical pages. A number of blocks can be included in a plane of memory cells and an array can include a number of planes. As one example, a memory device may be configured to store 8 KB (kilobytes) of user data per page, 128 pages of user data per block, 2048 blocks per plane, and 16 planes per device.

In operation, data can be written to and/or read from memory 110 as a page of data, for example. For example, a page of data can be referred to as a data transfer size of the memory system. Data can be sent to/from a host (e.g., host 102) in data segments referred to as sectors (e.g., host sectors). For example, a sector of data can be referred to as a data transfer size of the host.

Figure 2:
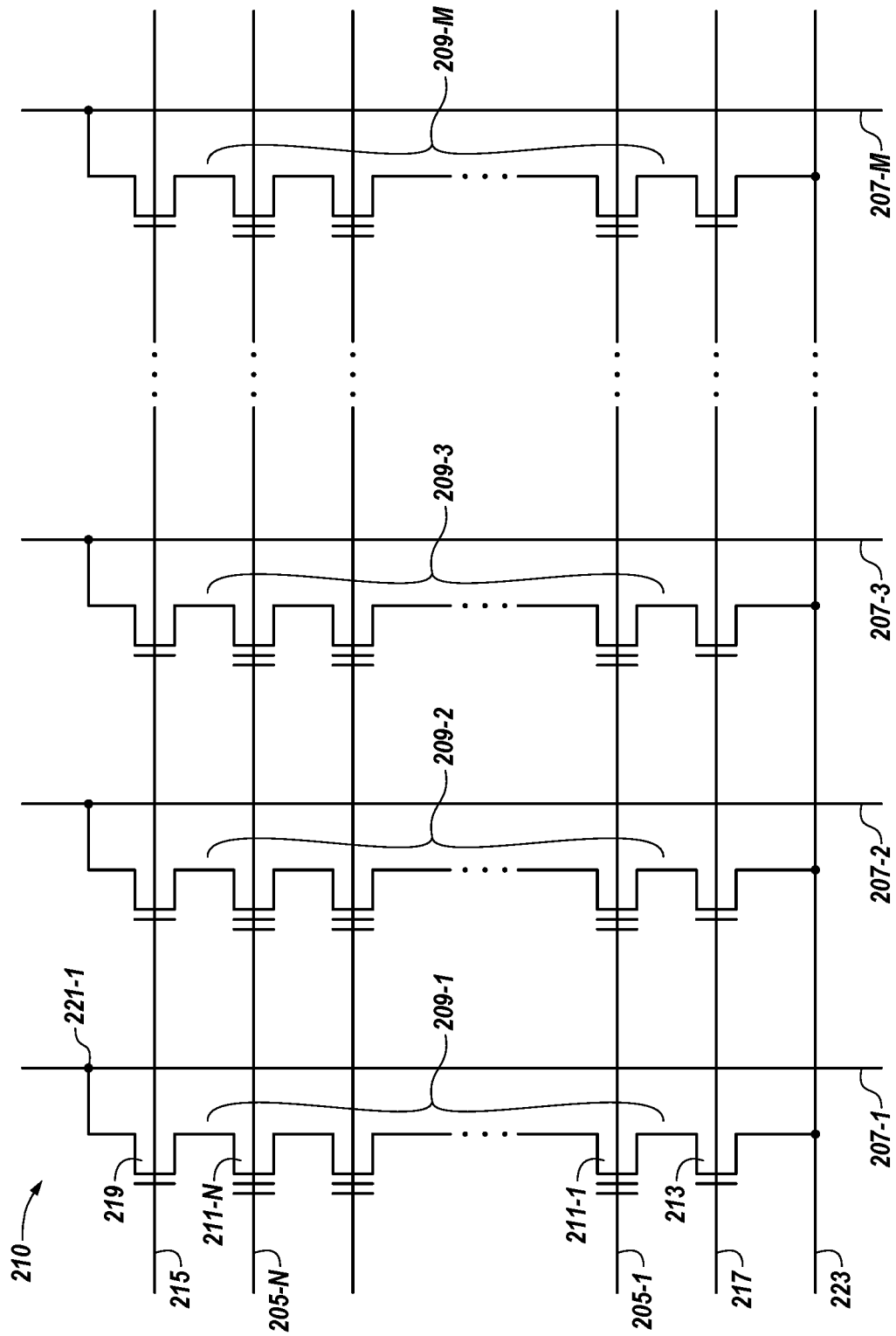
FIG. 2 is a schematic of a portion of memory comprising an array of memory cells operable in accordance with a number of embodiments of the present disclosure.

FIG. 2 is a schematic of a portion of memory 210 comprising an array of memory cells operable in accordance with a number of embodiments of the present disclosure. The embodiment of FIG. 2 illustrates a NAND architecture non-volatile memory array; however, embodiments described herein are not limited to this example. For example, a number of embodiments can implemented to a NOR architecture non-volatile memory array. As shown in FIG. 2, the memory array includes access lines (e.g., word lines 205-1, . . . , 205-N) and intersecting data lines (e.g., local bit lines 207-1, 207-2, 207-3, . . . , 207-M). For ease of addressing in the digital environment, the number of word lines 205-1, . . . , 205-N and the number of local bit lines 207-1, 207-2, 207-3, . . . , 207-M can be some power of two (e.g., 256 word lines by 4,096 bit lines).

The memory array includes NAND strings 209-1, 209-2, 209-3, . . . , 209-M. Each NAND string includes non-volatile memory cells 211-1, . . . , 211-N, each communicatively coupled to a respective word line 205-1, . . . , 205-N. Each NAND string (and its constituent memory cells) is also associated with a local bit line 207-1, 207-2, 207-3, . . . , 207-M. The memory cells 211-1, . . . , 211-N of each NAND string 209-1, 209-2, 209-3, . . . , 209-M are coupled in series source to drain between a select gate source (e.g., a field-effect transistor (FET) 213) and a select gate drain (e.g., FET 219). Each select gate source 213 is configured to selectively couple a respective NAND string to a common source 223 responsive to a signal on source select line 217, while each select gate drain 219 is configured to selectively couple a respective NAND string to a respective bit line responsive to a signal on drain select line 215.

As shown in the embodiment illustrated in FIG. 2, a source of select gate source 213 is coupled to a common source line 223. The drain of select gate source 213 is coupled to the source of the memory cell 211-1 of the corresponding NAND string 209-1. The drain of select gate drain 219 is coupled to bit line 207-1 of the corresponding NAND string 209-1 at drain contact 221-1. The source of select gate drain 219 is coupled to the drain of the last memory cell 211-N (e.g., a floating-gate transistor) of the corresponding NAND string 209-1.

In a number of embodiments, construction of the non-volatile memory cells 211-1, . . . , 211-N includes a source, a drain, a floating gate or other charge storage structure, and a control gate. The memory cells 211-1, . . . , 211-N have their control gates coupled to a word line, 205-1, . . . , 205-N, respectively. A NOR array architecture would be similarly laid out, except that the string of memory cells would be coupled in parallel between the select gates. For example, one end of each memory cell (e.g., a memory cell 211-N as illustrated in FIG. 2) can be coupled to a bit line, and another end of the same memory cell can be coupled to a source line that can be aligned in parallel with the bit line. Furthermore, a NOR architecture can provide for random access to the memory cells in the array (e.g., as opposed to page-based access as with a NAND architecture).

In operation, a number of memory cells coupled to a selected word line (e.g., 205-1, . . . , 205-N) can be written and/or read together as a group. A group of memory cells written and/or read together can be referred to as a page of cells (e.g., a physical page) and can store a number of pages of data (e.g., logical pages). A number of memory cells coupled to a particular word line and programmed together to respective data states can be referred to as a target page. A programming operation can include applying a number of program pulses (e.g., 16V-20V) to a selected word line in order to increase the threshold voltage (Vt) of selected cells coupled to that selected word line to a desired voltage level corresponding to a targeted data state.

Read operations can include sensing a voltage and/or current change of a bit line coupled to a selected cell in order to determine the state of the selected cell. The read operation can include precharging a bit line and sensing the discharge when a selected cell begins to conduct. One type of read operation comprises applying a ramping read signal to a selected word line, and another type of read operation comprises applying a plurality of discrete read signals to the selected word line to determine the states of the cells.

FIGS. 3A-3B illustrate a number of data patterns used for error correction code (ECC) operations in accordance with a number of embodiments of the present disclosure. The number of data patterns in FIG. 3A-3B are illustrated in a form of matrix, wherein each row of the matrix represents a particular data pattern and each column of the matrix represents a position in the data pattern. Although embodiments are not limited to determining a number of particular predetermined data patterns, FIG. 3A-3B illustrate only a portion of a number of data patterns that can be included to be the number of predetermined data patterns. The number of predetermined data patterns included in the matrix illustrated in FIGS. 3A-3B are included to ease balancing over each column of the matrix and expediting memory operation by limiting the number of bits in the matrix having a binary value of 1. A number of methods associated with determining the number of predetermined data patterns will be further described in below.

In a number of embodiments, a number of predetermined data patterns to include in the encoding matrix can be selected from the number of data patterns listed in FIG. 3A-3B based on various criteria. For example, each of the number of predetermined data patterns can be determined to have only an odd weight (e.g., an odd number of bits having a binary value 1). When the number of predetermined data patterns include an odd weight, the controller can determine whether a stored codeword includes a single bit error or two bit errors based on whether a syndrome (e.g., a result of an XOR operation on a stored ECC pattern and a computed ECC pattern) has an odd or an even weight. For example, if the syndrome has an odd weight (e.g., an odd syndrome), then the controller can conclude that there is a single bit error in the codeword and correct the erroneous bit. For example, if the syndrome has an even weight (e.g., an even syndrome), then the controller can be configured not to correct but alert that there are two bit errors. A number of embodiments associated with an ECC based on an odd or even syndrome will be further described below in association FIG. 4.

In a number of embodiments, adding an additional ECC bit to a number of ECC bits (e.g., a minimum number of ECC bits required to detect and correct a single bit error) allows a user to use those predetermined data patterns each having only an odd weight. In previous approaches, a well-known formula for determining how many ECC bits are required for a Hamming code is as follows:

$$d \leq 2^p - 1 - p$$

wherein, d represent a number of bits in a data word being encoded and p represents a number of ECC bits (e.g., parity bits). For example, when a 256-bit data word is to be encoded using the Hamming Code, at least 9 ECC bits are required because 9 ECC bits can protect up to 502 bits whereas 8 ECC bits can protect up to 247 bits according to the above equation. Using only those data patterns having an odd weight may halve the number of data patterns available because those data patterns having an even weight are not available. In this event, the above formula may be modified to properly reflect a number of embodiments of the present disclosure as follows:

$$d \leq \frac{2^p}{2} - p$$

which can be further simplified as follows:

$$d \leq 2^{p-1} - p$$

wherein d indicates the number of data patterns, with odd weight greater than one. Since each data bit in the encoded word uses one of these available patterns, d is also the maximum number of bits which may be encoded using this scheme. Thus, for the modified Hamming code with Hamming distance 4 herein described, 10 ECC bits can encode up to 502 data bits, while 9 ECC bits can protect a maximum of 247 data bits.

Figure 4:
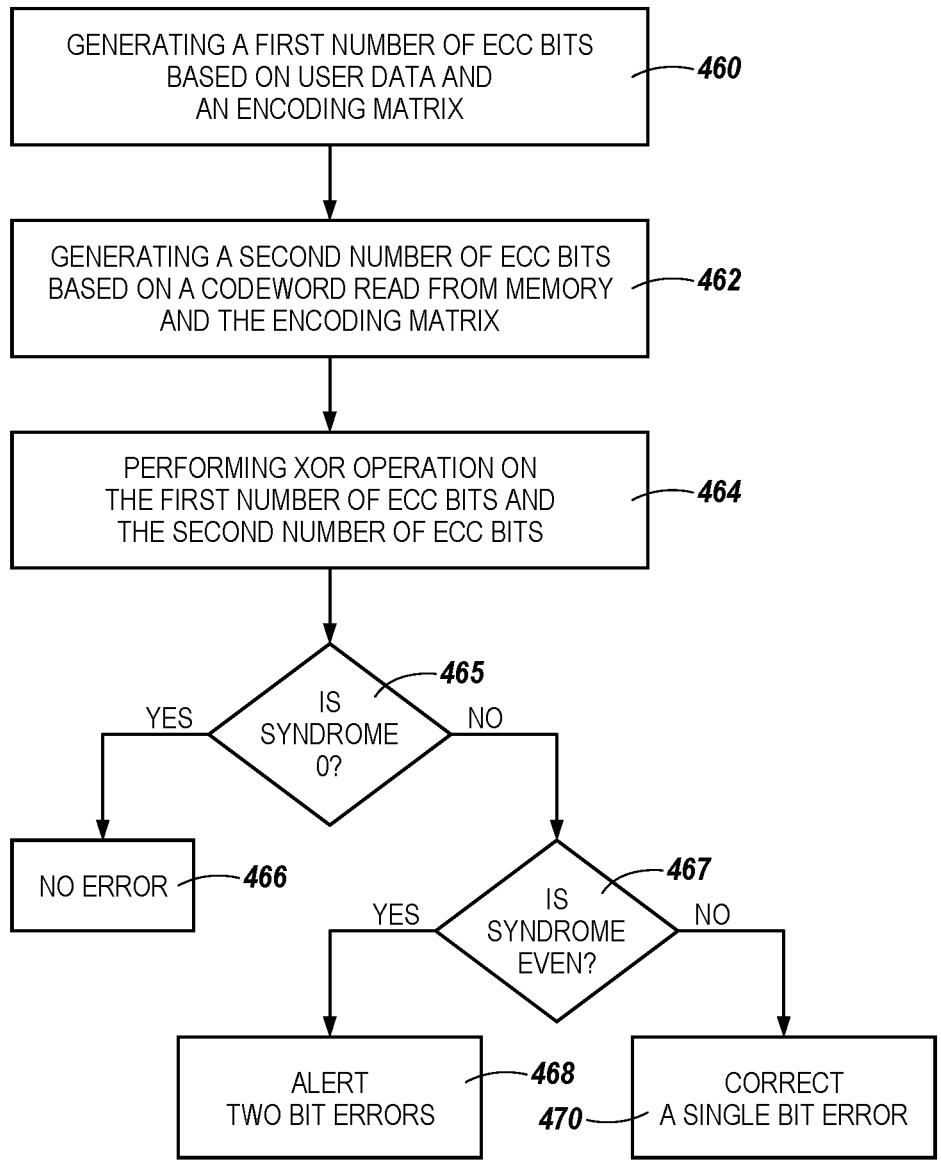
FIG. 4 illustrates a flow chart for performing an error correction code (ECC) operation in accordance with a number of embodiments of the present disclosure.

FIG. 3A illustrates a number of data patterns with an odd weight. For example, each data pattern can include a weight of one, three, five, seven, or nine, wherein data patterns having a weight of seven or nine are not illustrated in FIG. 3A. Having an odd weight in each data pattern can ensure that a total weight of a resulting codeword (e.g., including a data word and a number of ECC bits as illustrated in FIG. 4) will be even regardless of whether the data word being encoded has an odd or even weight. By ensuring that the resulting codeword has always an even weight, a single bit error or two bit errors can be distinguished based on whether a syndrome (e.g., a result of an error correction operation) is an odd or even. Although embodiments are not so limited, using a number of data patterns each having an even weight may not ensure that the resulting codeword always has even or odd weight. A number of embodiments associated with an ECC operation based on an odd or even syndrome will be further described below in association FIG. 4. To perform an ECC operation on user data consisting of 256 bits in accordance with a number of embodiments of the present disclosure, 266 data patterns can be determined, wherein each data pattern corresponds to particular bits of the codeword, which includes 256 bits of user data and 10 bits of the ECC pattern.

In a number of embodiments, when creating an encoding matrix (or decoding matrix when decoding the codeword as illustrated in FIG. 4) to perform an ECC operation the number of predetermined data patterns can include data patterns have a weight of three or five among those data patterns having an odd weight. By doing so, a total weight of the number of predetermined data patterns can be reduced to expedite an ECC operation. For example, a number of predetermined data patterns can be determined from all data patterns with a weight of three, and a portion of the data patterns with a weight of five. Since there are 10 different data patterns with a weight of one that will be associated with the ECC bits, and 120 different data patterns consisting with a weight of three, the remaining 136 predetermined data patterns can be determined from 252 different data patterns with a weight of five. Although, using all of the weight 3 terms and completing the codeword with weight 5 terms creates a code with a minimum total weight, embodiments are not limited to a particular criteria of determining a number of predetermined data patterns. For example, the codeword can be created using the higher weight patterns, such as weight 7 and/or weight 9 data patterns. Reducing a total weight can provide benefits such as enhancing speed of and reducing a size of a resulting circuitry (e.g., a circuitry required to perform a number of XOR operation of a logical XOR tree). Each bit having a binary value 1 in an encoding or decoding matrix represents an input in a logical XOR tree. By reducing a number of inputs in the logical XOR tree, the speed and the size of the resulting circuitry (or decoding matrix when decoding the codeword as illustrated in FIG. 4) can be enhanced and reduced.

In a number of embodiments, a number of predetermined data patterns can be selected to balance a weight over each column of the matrix of the number of predetermined data patterns. For an ease of balancing, the number of data patterns in FIG. 3A are arranged based on a number of rotation operations performed on a particular data pattern. Consider a number of data patterns 351 including first 10 data patterns as illustrated in FIG. 3A, wherein each of the number of data patterns 351 includes one bit having a binary value of 1. In this example, data pattern 0 represents a decimal value "1", and a left circular shift operation can be performed on data pattern 0. The operation shifts a bit having a binary value of 1 to the left by one, and the most significant bit to the rightmost position. This resulting data pattern can be set as data pattern 1, and following eight data patterns 2-9 of a number of data pattern 351 illustrated in FIG. 3A can be generated by performing the same operations eight times on the data pattern 0, which will evenly distribute a weight over each column within the data patterns 0-9. The number of data pattern 351 generated as described herein can be referred to as a first family.

FIG. 3A further illustrates a number of data patterns 353 each having a weight of three. The number of data patterns 353 can also be arranged as described above. For example, a second family consisting of data patterns 10-19 can be generated based on a data pattern 10, which represents the second least decimal value among the number of data patterns each having a bit having a binary value of 1 as the least significant bit. For example, data pattern 10 represents the second smallest decimal value after to the data pattern 0 where both data pattern 0 and data pattern 10 have a bit having a binary value 1 as the least significant bit. Upon generating the second family, a third family can be generated based on a number of rotation operations performed on data pattern 20, which represents the third smallest decimal value among the number of data patterns each having a bit having a binary value 1 as the least significant bit. Since performing the number of rotation operations can evenly distribute bits having a binary value of 1 within each family, determining a number of predetermined data patterns can be family-based to balance a weight over each column of the matrix.

A number of data patterns 355-1 each with a weight of five can also be arranged as described above. A family 355-2 of the number of data patterns 355 consists of only two data patterns since, for example, performing left circular shift operation twice on data pattern 380 will still result in same data pattern combination with that of data pattern 381.

FIG. 3B illustrates an example of determining a number of predetermined data patterns to balance the weight over each column of the matrix. When encoding a data word or decoding a codeword by using either an encoding matrix or decoding matrix (e.g., an encoding matrix and a decoding matrix shown in FIG. 3B), each bit having a binary value 1 represents a term in a logical XOR tree. Balancing the weight over each column of the matrix can provide an advantage of enhancing speed of a circuit performing a number of XOR operations on all bits of each column. For example, balancing the weight over each column can reduce a gap between the weight of each column, and reducing the gap can avoid a circumstance in which a particular column has much larger weight than other columns. Avoiding such circumstance can enhance the speed of the circuit because overall speed of the circuit will be determined by the particular column having the largest weight among all columns. Encoding a data word using an encoding matrix (e.g., an encoding matrix as illustrated in FIG. 3B) and decoding a codeword using a decoding matrix to perform an error correction operation (e.g., a decoding matrix as illustrated in FIG. 3B) in accordance with a number of embodiments of the present disclosure will be further described below.

In a number of embodiments, balancing the number of bits having a binary value of 1 over each column can be achieved by determining a number of predetermined data patterns on a family basis. For example, determining the entire second family in the above example automatically balances a number of bits having a binary value of 1 over each column. A user may choose a number of different mechanisms to determine a remaining number of predetermined data patterns after determining a number of predetermined data patterns on the family basis. For example, when 256 predetermined data patterns need to be determined, a user may initially determine 250 of the predetermined data patterns on the family basis, and may freely deselect determined data patterns or select additional data patterns to balance a number of bits having a binary value of 1 over each column. A number of methods associated with determining remaining number of predetermined data patterns will be further described in below.

In some embodiments, the first 256 number of data patterns with three and five weight can be determined to be a complete set of the number of predetermined data patterns forming the encoding matrix. However, doing so would result in a sum of the weight of each column as follows:

| col. 1 | col. 2 | col. 3 | col. 4 | col. 5 | col. 6 | col. 7 | col. 8 | col. 9 | col. 10 |
|---|---|---|---|---|---|---|---|---|---|
| 102 | 104 | 103 | 105 | 104 | 105 | 104 | 105 | 104 | 104, | wherein the weights are not regularly distributed over each column. As illustrated in FIG. 3B, the weight of each column can be balanced by determining a number of data patterns 354 to include in the number of predetermined data patterns. For example, as illustrated in FIG. 3B, the number of predetermined data patterns 354 can consist of a first set of a number of data patterns 10-130 that include some of the data patterns within a family generated based on data pattern 130, a second set of a number of data patterns 140-269, and a data pattern 380. As illustrated in FIG. 3B, a number of data patterns 357 within the family generated based on data pattern 130 are not selected, while only 5 data patterns within the same family are selected as a portion of the number of predetermine data patterns 354. However, embodiments are not limited to such data patterns. In this case, a weight in each column is as follows:

| col. 1 | col. 2 | col. 3 | col. 4 | col. 5 | col. 6 | col. 7 | col. 8 | col. 9 | col. 10 |
|---|---|---|---|---|---|---|---|---|---|
| 103 | 105 | 103 | 105 | 103 | 105 | 103 | 105 | 103 | 105, | wherein the weight is regularly distributed over each column. The encoding matrix having a weight of 103 and 105 alternatively over each column can have a benefit of reducing a size of circuitry (e.g., a circuitry required to perform a number of XOR operations) over an encoding matrix having a weight of 105 over each column. The data pattern 380 is selected instead of a data pattern 381 as illustrated in FIG. 3B. While the use of data pattern 381 would result in perfect balance with all columns having a weight of 104, data pattern 380 is selected because, by doing so, each column of the number of predetermined data patterns 10-265 each corresponding to a particular bit of the user data can have an odd weight. In a number of embodiments, having an odd weight over each column can ensure that a fully erased data word (e.g., a data word with all bits having a binary value of 1) has a corresponding ECC pattern of all bits having a binary value of 1, wherein a codeword (e.g., a word including a data word and ECC bits) with all bits having a binary value of 1 is a valid word in an NOR architecture. Although embodiments are not limited so, a fully erased data word with an encoding matrix having an even weight over each column may not result in a corresponding ECC pattern of all bits having a binary value of 1, wherein a corresponding codeword may not be a valid codeword. A complete set of the number of predetermined data patterns 354 illustrated in FIG. 3B is as follows:

| | | | | | | | | | | |
|---|---|---|---|---|---|---|---|---|---|---|
| Data Pattern 10 | 0 | 0 | 0 | 0 | 0 | 0 | 0 | 1 | 1 | 1 |
| Data Pattern 11 | 0 | 0 | 0 | 0 | 0 | 0 | 1 | 1 | 1 | 0 |
| Data Pattern 12 | 0 | 0 | 0 | 0 | 0 | 1 | 1 | 1 | 0 | 0 |
| Data Pattern 13 | 0 | 0 | 0 | 0 | 1 | 1 | 1 | 0 | 0 | 0 |
| Data Pattern 14 | 0 | 0 | 0 | 1 | 1 | 1 | 0 | 0 | 0 | 0 |
| Data Pattern 15 | 0 | 0 | 1 | 1 | 1 | 0 | 0 | 0 | 0 | 0 |
| Data Pattern 16 | 0 | 1 | 1 | 1 | 0 | 0 | 0 | 0 | 0 | 0 |
| Data Pattern 17 | 1 | 0 | 0 | 0 | 0 | 0 | 0 | 0 | 1 | 1 |
| Data Pattern 18 | 1 | 1 | 0 | 0 | 0 | 0 | 0 | 0 | 0 | 1 |
| Data Pattern 19 | 1 | 1 | 1 | 0 | 0 | 0 | 0 | 0 | 0 | 0 |
| Data Pattern 20 | 0 | 0 | 0 | 0 | 0 | 0 | 1 | 0 | 1 | 1 |
| Data Pattern 21 | 0 | 0 | 0 | 0 | 0 | 1 | 0 | 1 | 1 | 0 |
| Data Pattern 22 | 0 | 0 | 0 | 0 | 1 | 0 | 1 | 1 | 0 | 0 |
| Data Pattern 23 | 0 | 0 | 0 | 1 | 0 | 1 | 1 | 0 | 0 | 0 |
| Data Pattern 24 | 0 | 0 | 1 | 0 | 1 | 1 | 0 | 0 | 0 | 0 |
| Data Pattern 25 | 0 | 1 | 0 | 1 | 1 | 0 | 0 | 0 | 0 | 0 |
| Data Pattern 26 | 0 | 1 | 1 | 0 | 0 | 0 | 0 | 0 | 0 | 1 |
| Data Pattern 27 | 1 | 0 | 0 | 0 | 0 | 0 | 0 | 1 | 0 | 1 |
| Data Pattern 28 | 1 | 0 | 1 | 1 | 0 | 0 | 0 | 0 | 0 | 0 |
| Data Pattern 29 | 1 | 1 | 0 | 0 | 0 | 0 | 0 | 0 | 1 | 0 |
| Data Pattern 30 | 0 | 0 | 0 | 0 | 0 | 0 | 1 | 1 | 0 | 1 |
| Data Pattern 31 | 0 | 0 | 0 | 0 | 0 | 1 | 1 | 0 | 1 | 0 |
| Data Pattern 32 | 0 | 0 | 0 | 0 | 1 | 1 | 0 | 1 | 0 | 0 |
| Data Pattern 33 | 0 | 0 | 0 | 1 | 1 | 0 | 1 | 0 | 0 | 0 |
| Data Pattern 34 | 0 | 0 | 1 | 1 | 0 | 1 | 0 | 0 | 0 | 0 |
| Data Pattern 35 | 0 | 1 | 0 | 0 | 0 | 0 | 0 | 0 | 1 | 1 |
| Data Pattern 36 | 0 | 1 | 1 | 0 | 1 | 0 | 0 | 0 | 0 | 0 |

-continued

| | | | | | | | | | | |
|---|---|---|---|---|---|---|---|---|---|---|
| Data Pattern 37  | 1 | 0 | 0 | 0 | 0 | 0 | 0 | 1 | 1 | 0 |
| Data Pattern 38  | 1 | 0 | 1 | 0 | 0 | 0 | 0 | 0 | 0 | 1 |
| Data Pattern 39  | 1 | 1 | 0 | 1 | 0 | 0 | 0 | 0 | 0 | 0 |
| Data Pattern 40  | 0 | 0 | 0 | 0 | 0 | 1 | 0 | 0 | 1 | 1 |
| Data Pattern 41  | 0 | 0 | 0 | 0 | 1 | 0 | 0 | 0 | 1 | 1 |
| Data Pattern 42  | 0 | 0 | 0 | 1 | 0 | 0 | 1 | 1 | 0 | 0 |
| Data Pattern 43  | 0 | 0 | 1 | 0 | 0 | 1 | 1 | 0 | 0 | 0 |
| Data Pattern 44  | 0 | 0 | 1 | 1 | 0 | 0 | 0 | 0 | 0 | 1 |
| Data Pattern 45  | 0 | 1 | 0 | 0 | 1 | 1 | 0 | 0 | 0 | 0 |
| Data Pattern 46  | 0 | 1 | 1 | 0 | 0 | 0 | 0 | 1 | 0 | 0 |
| Data Pattern 47  | 1 | 0 | 0 | 0 | 0 | 1 | 0 | 0 | 0 | 1 |
| Data Pattern 48  | 1 | 0 | 0 | 1 | 1 | 0 | 0 | 0 | 0 | 0 |
| Data Pattern 49  | 1 | 1 | 0 | 0 | 0 | 0 | 0 | 0 | 0 | 0 |
| Data Pattern 50  | 0 | 0 | 0 | 0 | 0 | 1 | 0 | 1 | 0 | 1 |
| Data Pattern 51  | 0 | 0 | 0 | 0 | 1 | 0 | 1 | 0 | 1 | 0 |
| Data Pattern 52  | 0 | 0 | 0 | 1 | 0 | 1 | 0 | 1 | 0 | 0 |
| Data Pattern 53  | 0 | 0 | 1 | 0 | 1 | 0 | 1 | 0 | 0 | 0 |
| Data Pattern 54  | 0 | 1 | 0 | 0 | 0 | 0 | 0 | 1 | 0 | 1 |
| Data Pattern 55  | 0 | 1 | 0 | 1 | 0 | 0 | 0 | 0 | 0 | 1 |
| Data Pattern 56  | 0 | 1 | 0 | 1 | 0 | 1 | 0 | 0 | 0 | 0 |
| Data Pattern 57  | 1 | 0 | 0 | 0 | 0 | 0 | 1 | 0 | 1 | 0 |
| Data Pattern 58  | 1 | 0 | 1 | 0 | 0 | 0 | 0 | 1 | 0 | 0 |
| Data Pattern 59  | 1 | 0 | 1 | 0 | 1 | 0 | 0 | 0 | 0 | 0 |
| Data Pattern 60  | 0 | 0 | 0 | 0 | 0 | 1 | 1 | 0 | 0 | 1 |
| Data Pattern 61  | 0 | 0 | 0 | 0 | 1 | 1 | 0 | 0 | 1 | 0 |
| Data Pattern 62  | 0 | 0 | 0 | 1 | 1 | 0 | 0 | 1 | 0 | 0 |
| Data Pattern 63  | 0 | 0 | 1 | 0 | 0 | 0 | 0 | 0 | 1 | 1 |
| Data Pattern 64  | 0 | 0 | 1 | 1 | 0 | 0 | 1 | 0 | 0 | 0 |
| Data Pattern 65  | 0 | 1 | 0 | 0 | 0 | 0 | 1 | 1 | 0 | 0 |
| Data Pattern 66  | 0 | 1 | 1 | 0 | 0 | 1 | 0 | 0 | 0 | 0 |
| Data Pattern 67  | 1 | 0 | 0 | 0 | 0 | 1 | 1 | 0 | 0 | 0 |
| Data Pattern 68  | 1 | 0 | 0 | 1 | 0 | 0 | 0 | 0 | 0 | 1 |
| Data Pattern 69  | 1 | 1 | 0 | 0 | 1 | 0 | 0 | 0 | 0 | 0 |
| Data Pattern 70  | 0 | 0 | 0 | 0 | 1 | 0 | 0 | 0 | 1 | 1 |
| Data Pattern 71  | 0 | 0 | 0 | 1 | 0 | 0 | 0 | 1 | 1 | 0 |
| Data Pattern 72  | 0 | 0 | 0 | 1 | 1 | 0 | 0 | 0 | 0 | 1 |
| Data Pattern 73  | 0 | 0 | 1 | 0 | 0 | 0 | 1 | 1 | 0 | 0 |
| Data Pattern 74  | 0 | 0 | 1 | 1 | 0 | 0 | 0 | 0 | 1 | 0 |
| Data Pattern 75  | 0 | 1 | 0 | 0 | 0 | 1 | 1 | 0 | 0 | 0 |
| Data Pattern 76  | 0 | 1 | 1 | 0 | 0 | 0 | 1 | 0 | 0 | 0 |
| Data Pattern 77  | 1 | 0 | 0 | 0 | 0 | 1 | 0 | 0 | 0 | 1 |
| Data Pattern 78  | 1 | 0 | 0 | 0 | 1 | 1 | 0 | 0 | 0 | 0 |
| Data Pattern 79  | 1 | 1 | 0 | 0 | 0 | 0 | 1 | 0 | 0 | 0 |
| Data Pattern 80  | 0 | 0 | 0 | 0 | 1 | 0 | 0 | 1 | 0 | 1 |
| Data Pattern 81  | 0 | 0 | 0 | 1 | 0 | 1 | 0 | 1 | 0 | 0 |
| Data Pattern 82  | 0 | 0 | 1 | 0 | 0 | 1 | 0 | 1 | 0 | 0 |
| Data Pattern 83  | 0 | 0 | 1 | 0 | 1 | 0 | 0 | 0 | 0 | 1 |
| Data Pattern 84  | 0 | 1 | 0 | 0 | 0 | 0 | 1 | 0 | 0 | 1 |
| Data Pattern 85  | 0 | 1 | 0 | 1 | 0 | 1 | 0 | 0 | 0 | 0 |
| Data Pattern 86  | 0 | 1 | 1 | 0 | 0 | 0 | 0 | 1 | 0 | 0 |
| Data Pattern 87  | 1 | 0 | 0 | 0 | 0 | 1 | 0 | 0 | 1 | 0 |
| Data Pattern 88  | 1 | 0 | 0 | 1 | 0 | 1 | 0 | 0 | 0 | 0 |
| Data Pattern 89  | 1 | 0 | 1 | 0 | 0 | 0 | 0 | 1 | 0 | 0 |
| Data Pattern 90  | 0 | 0 | 0 | 0 | 1 | 0 | 1 | 0 | 0 | 1 |
| Data Pattern 91  | 0 | 0 | 0 | 1 | 0 | 1 | 0 | 0 | 1 | 0 |
| Data Pattern 92  | 0 | 0 | 1 | 0 | 0 | 0 | 0 | 1 | 0 | 1 |
| Data Pattern 93  | 0 | 0 | 1 | 0 | 1 | 0 | 0 | 1 | 0 | 0 |
| Data Pattern 94  | 0 | 1 | 0 | 0 | 0 | 0 | 1 | 0 | 1 | 0 |
| Data Pattern 95  | 0 | 1 | 0 | 0 | 1 | 0 | 0 | 0 | 0 | 1 |
| Data Pattern 96  | 0 | 1 | 0 | 1 | 0 | 0 | 1 | 0 | 0 | 0 |
| Data Pattern 97  | 1 | 0 | 0 | 0 | 1 | 0 | 1 | 0 | 0 | 0 |
| Data Pattern 98  | 1 | 0 | 0 | 1 | 0 | 0 | 0 | 1 | 0 | 0 |
| Data Pattern 99  | 1 | 0 | 1 | 0 | 0 | 1 | 0 | 0 | 0 | 0 |
| Data Pattern 100 | 0 | 0 | 0 | 0 | 1 | 1 | 0 | 0 | 0 | 1 |
| Data Pattern 101 | 0 | 0 | 0 | 0 | 1 | 0 | 0 | 0 | 1 | 1 |
| Data Pattern 102 | 0 | 0 | 0 | 1 | 1 | 0 | 0 | 0 | 1 | 0 |
| Data Pattern 103 | 0 | 0 | 1 | 0 | 0 | 0 | 0 | 1 | 1 | 0 |
| Data Pattern 104 | 0 | 0 | 1 | 1 | 0 | 0 | 0 | 1 | 0 | 0 |
| Data Pattern 105 | 0 | 1 | 0 | 0 | 0 | 0 | 1 | 1 | 0 | 0 |
| Data Pattern 106 | 0 | 1 | 1 | 0 | 0 | 0 | 1 | 0 | 0 | 0 |
| Data Pattern 107 | 1 | 0 | 0 | 0 | 0 | 1 | 1 | 0 | 0 | 0 |
| Data Pattern 108 | 1 | 0 | 0 | 0 | 1 | 0 | 0 | 0 | 0 | 1 |
| Data Pattern 109 | 1 | 1 | 0 | 0 | 0 | 1 | 0 | 0 | 0 | 0 |
| Data Pattern 110 | 0 | 0 | 0 | 0 | 1 | 0 | 0 | 1 | 0 | 1 |
| Data Pattern 111 | 0 | 0 | 0 | 1 | 0 | 0 | 1 | 0 | 0 | 1 |
| Data Pattern 112 | 0 | 0 | 1 | 0 | 0 | 0 | 1 | 0 | 1 | 0 |
| Data Pattern 113 | 0 | 0 | 1 | 0 | 1 | 0 | 0 | 0 | 1 | 0 |
| Data Pattern 114 | 0 | 1 | 0 | 0 | 0 | 1 | 0 | 0 | 0 | 1 |
| Data Pattern 115 | 0 | 1 | 0 | 0 | 0 | 1 | 0 | 1 | 0 | 0 |
| Data Pattern 116 | 0 | 1 | 0 | 1 | 0 | 0 | 0 | 1 | 0 | 0 |
| Data Pattern 117 | 1 | 0 | 0 | 0 | 1 | 0 | 0 | 0 | 1 | 0 |
| Data Pattern 118 | 1 | 0 | 0 | 0 | 1 | 0 | 1 | 0 | 0 | 0 |
| Data Pattern 119 | 1 | 0 | 1 | 0 | 0 | 0 | 1 | 0 | 0 | 0 |
| Data Pattern 120 | 0 | 0 | 0 | 1 | 0 | 0 | 1 | 0 | 0 | 1 |
| Data Pattern 121 | 0 | 0 | 1 | 0 | 0 | 0 | 1 | 0 | 0 | 1 |
| Data Pattern 122 | 0 | 0 | 1 | 0 | 0 | 1 | 0 | 0 | 0 | 1 |
| Data Pattern 123 | 0 | 0 | 1 | 0 | 0 | 1 | 0 | 0 | 1 | 0 |
| Data Pattern 124 | 0 | 1 | 0 | 0 | 0 | 1 | 0 | 0 | 1 | 0 |
| Data Pattern 125 | 0 | 1 | 0 | 0 | 1 | 0 | 0 | 0 | 1 | 0 |
| Data Pattern 126 | 0 | 1 | 0 | 0 | 1 | 0 | 0 | 1 | 0 | 0 |
| Data Pattern 127 | 1 | 0 | 0 | 0 | 1 | 0 | 0 | 1 | 0 | 0 |
| Data Pattern 128 | 1 | 0 | 0 | 1 | 0 | 0 | 1 | 0 | 0 | 0 |
| Data Pattern 129 | 1 | 0 | 0 | 1 | 0 | 0 | 1 | 0 | 0 | 0 |
| Data Pattern 130 | 0 | 0 | 0 | 0 | 0 | 1 | 1 | 1 | 1 | 1 |
| Data Pattern 131 | 0 | 0 | 0 | 1 | 1 | 1 | 1 | 0 | 0 | 0 |
| Data Pattern 132 | 0 | 1 | 1 | 1 | 1 | 0 | 0 | 0 | 0 | 0 |
| Data Pattern 133 | 1 | 1 | 0 | 0 | 0 | 0 | 1 | 1 | 1 | 1 |
| Data Pattern 134 | 1 | 1 | 1 | 1 | 0 | 0 | 0 | 0 | 0 | 1 |
| Data Pattern 135 | 0 | 0 | 0 | 0 | 1 | 0 | 1 | 1 | 1 | 1 |
| Data Pattern 136 | 0 | 0 | 0 | 1 | 0 | 1 | 1 | 1 | 1 | 0 |
| Data Pattern 137 | 0 | 0 | 1 | 0 | 1 | 1 | 1 | 1 | 0 | 0 |
| Data Pattern 138 | 0 | 1 | 0 | 1 | 1 | 1 | 1 | 0 | 0 | 0 |
| Data Pattern 139 | 0 | 1 | 1 | 1 | 1 | 0 | 0 | 0 | 0 | 1 |
| Data Pattern 140 | 1 | 0 | 0 | 0 | 0 | 1 | 0 | 1 | 1 | 1 |
| Data Pattern 141 | 1 | 0 | 1 | 1 | 1 | 1 | 0 | 0 | 0 | 0 |
| Data Pattern 142 | 1 | 1 | 0 | 0 | 0 | 0 | 1 | 0 | 1 | 1 |
| Data Pattern 143 | 1 | 1 | 1 | 0 | 0 | 0 | 0 | 1 | 0 | 1 |
| Data Pattern 144 | 1 | 1 | 1 | 1 | 0 | 0 | 0 | 0 | 1 | 0 |
| Data Pattern 145 | 0 | 0 | 0 | 0 | 1 | 1 | 0 | 1 | 1 | 1 |
| Data Pattern 146 | 0 | 0 | 0 | 1 | 1 | 0 | 1 | 1 | 1 | 0 |
| Data Pattern 147 | 0 | 0 | 1 | 1 | 0 | 1 | 1 | 1 | 0 | 0 |
| Data Pattern 148 | 0 | 1 | 1 | 0 | 1 | 1 | 1 | 0 | 0 | 0 |
| Data Pattern 149 | 0 | 1 | 1 | 1 | 0 | 0 | 0 | 0 | 1 | 1 |
| Data Pattern 150 | 1 | 0 | 0 | 0 | 0 | 1 | 1 | 0 | 1 | 1 |
| Data Pattern 151 | 1 | 0 | 1 | 1 | 1 | 0 | 0 | 0 | 0 | 1 |
| Data Pattern 152 | 1 | 1 | 0 | 0 | 0 | 0 | 1 | 1 | 0 | 1 |
| Data Pattern 153 | 1 | 1 | 0 | 1 | 1 | 1 | 0 | 0 | 0 | 0 |
| Data Pattern 154 | 1 | 1 | 1 | 0 | 0 | 0 | 0 | 1 | 1 | 0 |
| Data Pattern 155 | 0 | 0 | 0 | 0 | 1 | 1 | 1 | 0 | 1 | 1 |
| Data Pattern 156 | 0 | 0 | 0 | 1 | 1 | 1 | 0 | 1 | 1 | 0 |
| Data Pattern 157 | 0 | 0 | 1 | 1 | 1 | 0 | 1 | 1 | 0 | 0 |
| Data Pattern 158 | 0 | 1 | 0 | 0 | 0 | 0 | 1 | 1 | 1 | 1 |
| Data Pattern 159 | 0 | 1 | 1 | 1 | 0 | 1 | 1 | 0 | 0 | 0 |
| Data Pattern 160 | 1 | 0 | 0 | 0 | 0 | 1 | 1 | 1 | 0 | 1 |
| Data Pattern 161 | 1 | 0 | 1 | 1 | 0 | 0 | 0 | 0 | 1 | 1 |
| Data Pattern 162 | 1 | 1 | 0 | 0 | 0 | 0 | 1 | 1 | 1 | 0 |
| Data Pattern 163 | 1 | 1 | 0 | 1 | 1 | 0 | 0 | 0 | 0 | 1 |
| Data Pattern 164 | 1 | 1 | 1 | 0 | 1 | 1 | 0 | 0 | 0 | 0 |
| Data Pattern 165 | 0 | 0 | 0 | 0 | 1 | 1 | 1 | 1 | 0 | 1 |
| Data Pattern 166 | 0 | 0 | 0 | 1 | 1 | 1 | 1 | 0 | 1 | 0 |
| Data Pattern 167 | 0 | 0 | 1 | 1 | 1 | 1 | 0 | 1 | 0 | 0 |
| Data Pattern 168 | 0 | 1 | 0 | 0 | 0 | 1 | 1 | 1 | 1 | 1 |
| Data Pattern 169 | 0 | 1 | 1 | 1 | 1 | 0 | 1 | 0 | 0 | 0 |
| Data Pattern 170 | 1 | 0 | 0 | 0 | 0 | 1 | 1 | 1 | 1 | 0 |
| Data Pattern 171 | 1 | 0 | 1 | 0 | 0 | 0 | 0 | 1 | 1 | 1 |
| Data Pattern 172 | 1 | 1 | 0 | 1 | 0 | 0 | 0 | 0 | 1 | 1 |
| Data Pattern 173 | 1 | 1 | 1 | 0 | 1 | 0 | 0 | 0 | 0 | 1 |
| Data Pattern 174 | 1 | 1 | 1 | 1 | 0 | 1 | 0 | 0 | 0 | 1 |
| Data Pattern 175 | 0 | 0 | 0 | 1 | 0 | 0 | 1 | 1 | 1 | 1 |
| Data Pattern 176 | 0 | 0 | 1 | 0 | 1 | 1 | 1 | 1 | 0 | 0 |
| Data Pattern 177 | 0 | 0 | 1 | 1 | 1 | 1 | 0 | 0 | 0 | 1 |
| Data Pattern 178 | 0 | 1 | 0 | 0 | 1 | 1 | 1 | 1 | 0 | 0 |
| Data Pattern 179 | 0 | 1 | 1 | 1 | 0 | 0 | 0 | 1 | 0 | 1 |
| Data Pattern 180 | 1 | 0 | 0 | 0 | 1 | 0 | 0 | 1 | 1 | 1 |
| Data Pattern 181 | 1 | 0 | 0 | 1 | 1 | 1 | 1 | 0 | 0 | 0 |
| Data Pattern 182 | 1 | 1 | 0 | 0 | 0 | 1 | 0 | 0 | 1 | 1 |
| Data Pattern 183 | 1 | 1 | 0 | 0 | 1 | 0 | 0 | 0 | 1 | 1 |
| Data Pattern 184 | 1 | 1 | 1 | 1 | 0 | 1 | 1 | 0 | 0 | 0 |
| Data Pattern 185 | 0 | 0 | 0 | 1 | 0 | 1 | 0 | 1 | 1 | 1 |
| Data Pattern 186 | 0 | 0 | 1 | 0 | 1 | 0 | 1 | 1 | 1 | 0 |
| Data Pattern 187 | 0 | 1 | 0 | 1 | 0 | 1 | 1 | 1 | 0 | 0 |
| Data Pattern 188 | 0 | 1 | 1 | 1 | 1 | 1 | 0 | 0 | 0 | 1 |
| Data Pattern 189 | 0 | 1 | 1 | 1 | 0 | 0 | 0 | 1 | 1 | 0 |
| Data Pattern 190 | 1 | 0 | 0 | 0 | 1 | 0 | 1 | 0 | 1 | 1 |
| Data Pattern 191 | 1 | 0 | 1 | 0 | 1 | 1 | 1 | 0 | 0 | 0 |
| Data Pattern 192 | 1 | 0 | 1 | 1 | 1 | 0 | 0 | 0 | 1 | 0 |
| Data Pattern 193 | 1 | 1 | 0 | 0 | 0 | 1 | 0 | 1 | 0 | 1 |
| Data Pattern 194 | 1 | 1 | 1 | 0 | 0 | 0 | 1 | 0 | 1 | 0 |

-continued

| | | | | | | | | | | |
|---|---|---|---|---|---|---|---|---|---|---|
| Data Pattern 195 | 0 | 0 | 0 | 1 | 0 | 1 | 1 | 0 | 1 | 1 |
| Data Pattern 196 | 0 | 0 | 1 | 0 | 1 | 1 | 0 | 1 | 1 | 0 |
| Data Pattern 197 | 0 | 1 | 0 | 1 | 1 | 0 | 1 | 1 | 0 | 0 |
| Data Pattern 198 | 0 | 1 | 1 | 0 | 0 | 0 | 1 | 0 | 1 | 1 |
| Data Pattern 199 | 0 | 1 | 1 | 0 | 1 | 1 | 0 | 0 | 0 | 1 |
| Data Pattern 200 | 1 | 0 | 0 | 0 | 1 | 0 | 1 | 1 | 0 | 1 |
| Data Pattern 201 | 1 | 0 | 1 | 1 | 0 | 0 | 0 | 1 | 0 | 1 |
| Data Pattern 202 | 1 | 0 | 1 | 1 | 0 | 1 | 1 | 0 | 0 | 0 |
| Data Pattern 203 | 1 | 1 | 0 | 0 | 0 | 1 | 0 | 1 | 1 | 0 |
| Data Pattern 204 | 1 | 1 | 0 | 1 | 0 | 0 | 0 | 1 | 0 | 0 |
| Data Pattern 205 | 0 | 0 | 0 | 1 | 0 | 1 | 1 | 1 | 0 | 1 |
| Data Pattern 206 | 0 | 0 | 1 | 0 | 1 | 1 | 1 | 0 | 1 | 0 |
| Data Pattern 207 | 0 | 1 | 0 | 0 | 0 | 1 | 0 | 1 | 1 | 1 |
| Data Pattern 208 | 0 | 1 | 0 | 1 | 1 | 1 | 0 | 1 | 0 | 0 |
| Data Pattern 209 | 0 | 1 | 1 | 1 | 0 | 1 | 0 | 0 | 0 | 1 |
| Data Pattern 210 | 1 | 0 | 0 | 0 | 1 | 0 | 1 | 1 | 1 | 0 |
| Data Pattern 211 | 1 | 0 | 1 | 0 | 0 | 0 | 1 | 0 | 1 | 1 |
| Data Pattern 212 | 1 | 0 | 1 | 1 | 1 | 0 | 1 | 0 | 0 | 0 |
| Data Pattern 213 | 1 | 1 | 0 | 1 | 0 | 0 | 0 | 1 | 0 | 1 |
| Data Pattern 214 | 1 | 1 | 1 | 0 | 1 | 0 | 0 | 0 | 1 | 0 |
| Data Pattern 215 | 0 | 0 | 0 | 1 | 1 | 0 | 0 | 1 | 1 | 1 |
| Data Pattern 216 | 0 | 0 | 1 | 1 | 0 | 0 | 1 | 1 | 1 | 0 |
| Data Pattern 217 | 0 | 0 | 1 | 1 | 1 | 0 | 0 | 0 | 1 | 1 |
| Data Pattern 218 | 0 | 1 | 1 | 0 | 0 | 1 | 1 | 1 | 0 | 0 |
| Data Pattern 219 | 0 | 1 | 1 | 1 | 0 | 0 | 0 | 1 | 1 | 0 |
| Data Pattern 220 | 1 | 0 | 0 | 0 | 1 | 1 | 0 | 0 | 1 | 1 |
| Data Pattern 221 | 1 | 0 | 0 | 1 | 1 | 1 | 0 | 0 | 0 | 1 |
| Data Pattern 222 | 1 | 1 | 0 | 0 | 0 | 1 | 1 | 0 | 0 | 1 |
| Data Pattern 223 | 1 | 1 | 0 | 0 | 1 | 1 | 1 | 0 | 0 | 0 |
| Data Pattern 224 | 1 | 1 | 1 | 0 | 0 | 0 | 1 | 0 | 0 | 0 |
| Data Pattern 225 | 0 | 0 | 0 | 1 | 1 | 0 | 1 | 0 | 1 | 1 |
| Data Pattern 226 | 0 | 0 | 1 | 1 | 0 | 1 | 0 | 1 | 1 | 0 |
| Data Pattern 227 | 0 | 1 | 0 | 1 | 1 | 0 | 0 | 0 | 1 | 1 |
| Data Pattern 228 | 0 | 1 | 1 | 0 | 0 | 0 | 1 | 1 | 0 | 1 |
| Data Pattern 229 | 0 | 1 | 1 | 0 | 1 | 0 | 1 | 1 | 0 | 0 |
| Data Pattern 230 | 1 | 0 | 0 | 0 | 1 | 1 | 0 | 1 | 0 | 1 |
| Data Pattern 231 | 1 | 0 | 1 | 0 | 1 | 1 | 0 | 0 | 0 | 1 |
| Data Pattern 232 | 1 | 0 | 1 | 1 | 0 | 0 | 0 | 1 | 1 | 0 |
| Data Pattern 233 | 1 | 1 | 0 | 0 | 0 | 1 | 1 | 0 | 1 | 0 |
| Data Pattern 234 | 1 | 1 | 0 | 1 | 0 | 1 | 1 | 0 | 0 | 0 |
| Data Pattern 235 | 0 | 0 | 0 | 1 | 0 | 1 | 1 | 0 | 1 | 1 |
| Data Pattern 236 | 0 | 0 | 1 | 1 | 0 | 1 | 1 | 0 | 1 | 0 |
| Data Pattern 237 | 0 | 1 | 0 | 0 | 0 | 1 | 1 | 0 | 1 | 1 |
| Data Pattern 238 | 0 | 1 | 1 | 0 | 1 | 0 | 0 | 0 | 1 | 1 |
| Data Pattern 239 | 0 | 1 | 1 | 0 | 1 | 1 | 0 | 1 | 0 | 0 |
| Data Pattern 240 | 1 | 0 | 0 | 0 | 1 | 1 | 0 | 1 | 1 | 0 |
| Data Pattern 241 | 1 | 0 | 1 | 0 | 0 | 0 | 1 | 1 | 0 | 1 |
| Data Pattern 242 | 1 | 0 | 1 | 1 | 0 | 1 | 0 | 0 | 0 | 1 |
| Data Pattern 243 | 1 | 1 | 0 | 1 | 0 | 0 | 0 | 1 | 1 | 0 |
| Data Pattern 244 | 1 | 1 | 0 | 1 | 1 | 0 | 1 | 0 | 0 | 0 |
| Data Pattern 245 | 0 | 0 | 0 | 1 | 1 | 1 | 0 | 0 | 1 | 1 |
| Data Pattern 246 | 0 | 0 | 1 | 1 | 0 | 0 | 0 | 1 | 1 | 1 |
| Data Pattern 247 | 0 | 0 | 1 | 1 | 1 | 0 | 1 | 1 | 1 | 0 |
| Data Pattern 248 | 0 | 1 | 1 | 0 | 0 | 1 | 1 | 1 | 0 | 0 |
| Data Pattern 249 | 0 | 1 | 1 | 1 | 0 | 0 | 1 | 1 | 0 | 0 |
| Data Pattern 250 | 1 | 0 | 0 | 0 | 1 | 1 | 1 | 0 | 0 | 1 |
| Data Pattern 251 | 1 | 0 | 0 | 1 | 1 | 0 | 0 | 0 | 1 | 1 |
| Data Pattern 252 | 1 | 1 | 0 | 0 | 0 | 1 | 1 | 1 | 0 | 0 |
| Data Pattern 253 | 1 | 1 | 0 | 0 | 1 | 0 | 0 | 0 | 0 | 1 |
| Data Pattern 254 | 1 | 1 | 1 | 0 | 0 | 1 | 1 | 0 | 0 | 0 |
| Data Pattern 255 | 0 | 0 | 0 | 1 | 1 | 1 | 0 | 1 | 0 | 1 |
| Data Pattern 256 | 0 | 0 | 1 | 1 | 1 | 0 | 1 | 1 | 0 | 0 |
| Data Pattern 257 | 0 | 1 | 0 | 0 | 0 | 1 | 1 | 0 | 1 | 1 |
| Data Pattern 258 | 0 | 1 | 0 | 1 | 0 | 0 | 0 | 1 | 1 | 1 |
| Data Pattern 259 | 0 | 1 | 1 | 1 | 0 | 1 | 0 | 1 | 0 | 0 |
| Data Pattern 260 | 1 | 0 | 0 | 0 | 1 | 1 | 1 | 0 | 1 | 0 |
| Data Pattern 261 | 1 | 0 | 1 | 0 | 0 | 0 | 1 | 1 | 1 | 0 |
| Data Pattern 262 | 1 | 0 | 1 | 0 | 1 | 0 | 0 | 0 | 1 | 1 |
| Data Pattern 263 | 1 | 1 | 0 | 1 | 0 | 1 | 0 | 0 | 0 | 1 |
| Data Pattern 264 | 1 | 1 | 1 | 0 | 1 | 0 | 1 | 0 | 0 | 0 |
| Data Pattern 265 | 0 | 1 | 0 | 1 | 0 | 1 | 0 | 1 | 0 | 1 |

However, a number of embodiments of the present disclosure is not limited to a particular method of balancing a number of 1s over each column of the matrix.

The above set of the number of predetermined data patterns 354 can constitute an encoding matrix that can be used to encode a 256-bit data word. When encoding, 10 additional ECC bits can be generated based on the 256-bit data word by using the encoding matrix, and stored in a memory (e.g., a memory 110 as illustrated in FIG. 1). When performing an error correction operation in accordance with a number of embodiments of the present disclosure, a 266-bit codeword can be decoded by using a decoding matrix, which can include following 10 additional data patterns:

| | | | | | | | | | | |
|---|---|---|---|---|---|---|---|---|---|---|
| Data Pattern 0 | 0 | 0 | 0 | 0 | 0 | 0 | 0 | 0 | 0 | 1 |
| Data Pattern 1 | 0 | 0 | 0 | 0 | 0 | 0 | 0 | 0 | 1 | 0 |
| Data Pattern 2 | 0 | 0 | 0 | 0 | 0 | 0 | 0 | 1 | 0 | 0 |
| Data Pattern 3 | 0 | 0 | 0 | 0 | 0 | 0 | 1 | 0 | 0 | 0 |
| Data Pattern 4 | 0 | 0 | 0 | 0 | 0 | 1 | 0 | 0 | 0 | 0 |
| Data Pattern 5 | 0 | 0 | 0 | 0 | 1 | 0 | 0 | 0 | 0 | 0 |
| Data Pattern 6 | 0 | 0 | 0 | 1 | 0 | 0 | 0 | 0 | 0 | 0 |
| Data Pattern 7 | 0 | 0 | 1 | 0 | 0 | 0 | 0 | 0 | 0 | 0 |
| Data Pattern 8 | 0 | 1 | 0 | 0 | 0 | 0 | 0 | 0 | 0 | 0 |
| Data Pattern 9 | 1 | 0 | 0 | 0 | 0 | 0 | 0 | 0 | 0 | 0 |

As a result, as illustrated in FIG. 3B, the decoding matrix can include 266 data patterns including a number of data patterns 352 in addition to the number of data patterns 354 constituting the encoding matrix.

In a number of embodiments, each of a number of predetermined data patterns can be assigned to each corresponding bit of a codeword. For example, a first family as illustrated in above, wherein each data pattern of the first family include only terms of weight one, can be assigned to each corresponding bit of an ECC pattern. For example, a data pattern 0 can be assigned to a bit 0 of the ECC pattern. Then, a remaining number of predetermined data patterns, wherein each data pattern includes either a weight of three or five can be assigned to each corresponding bit of a binary data word (e.g., data patterns 10-265 each assigned to 256 bits of the data word).

In a number of embodiments, a controller can generate an ECC pattern based on a number of predetermined data patterns. For example, the controller can determine the number of predetermined data patterns that corresponds to each bit of data word having a binary value of 1. Upon determining the number of predetermined data patterns, the controller, then, can perform a number of XOR operations on each of the number of predetermined data patterns to generate the ECC pattern.

Following is an example of generating an ECC pattern using a number of predetermined data patterns in accordance with a number of embodiments of the present disclosure. Although each of the number of predetermined data patterns is not limited to a particular pattern, the number of predetermined data patterns can be analogous to that of the number of predetermined data patterns illustrated in FIG. 3B.

In some embodiments, user data can be in the form of a binary data word and can include the first three bits having a binary value of 1 and the remaining 253 bits can have a binary value of 0. Therefore, the example binary data word can be:

111000000 . . . . 000 wherein, only first three bits of the example binary data word have a binary value of 1. Upon determining a number and a location of bits of the data word having a binary value of 1, the controller can determine the number of predetermined data patterns corresponding to each bit having a binary value of 1. In this example, according to FIG. 3B, the predetermined data patterns for bit 0, bit 1, and bit 2 of the example binary data word are:

DATA BIT 0: 0 0 0 0 0 0 0 1 1 1
DATA BIT 1: 0 0 0 0 0 0 1 1 1 0
DATA BIT 2: 0 0 0 0 0 1 1 1 0 0

Upon determining the number of predetermined data patterns that correspond to the bits of the example binary data word, the controller can perform a number of XOR operations. In this example, the controller performs an XOR operation on bit 0 and bit 1 first, and another XOR operation on the result of the XOR operation (on bit 0 and bit 1) and bit 2. The syndrome is

| DATA BIT 0: | 0 0 0 0 0 0 0 1 1 1 |
| XOR DATA BIT 1: | 0 0 0 0 0 0 1 1 1 0 |
| | 0 0 0 0 0 0 1 0 0 1 |

Upon performing the first XOR operation, the controller can also perform another XOR operation as follows:

| XOR (DATA BIT 0 & DATA BIT 1): | 0 0 0 0 0 0 1 0 0 1 |
| DATA BIT 2: | 0 0 0 0 0 1 1 1 0 0 |
| | 0 0 0 0 0 1 0 1 0 1 |

When the controller completes performing the number of XOR operations on each bit having a binary value of 1, the controller can determine the result of the number of XOR operations as an ECC pattern. Therefore, according to the example, the controller can determine the ECC pattern as follows:

0 0 0 0 0 1 0 1 0 1

Upon generating an ECC pattern, the controller can encodes the example binary data word with the ECC pattern as a codeword, and write the codeword to memory. Detecting and correcting a single bit error and two bit errors using the ECC pattern in the codeword in accordance with a number of embodiments of the present disclosure will be further described below in association with in FIG. 4.

FIG. 4 illustrates a flow chart for performing an error correction code (ECC) operation in accordance with a number of embodiments of the present disclosure. In a number of embodiments, an ECC pattern including a first number of ECC bits can be generated based on user data and an encoding matrix at step 460. The first number of ECC bits can be generated as described above in association with FIG. 3B and stored with the user data as a codeword. An ECC pattern including a second number of ECC bits can be generated based on the codeword read from memory and an encoding matrix at step 462. Once the codeword is read from the memory, an XOR operation can be performed on the stored ECC pattern and a computed ECC pattern, which is generated based on the data word read from the memory at step 464.

In a number of embodiments, a controller (e.g., controller 108 described in FIG. 1) can determine that the binary codeword read from the memory has no erroneous bits (e.g., errors) based on the result of the XOR operation on the stored ECC pattern and the computed ECC pattern, which is called a syndrome. For example, if the syndrome is zero, then the controller can determine that there is no error in the stored codeword as illustrated in step 466. Further, the controller can determine whether the binary codeword has a single bit error or two bit errors based on whether the syndrome corresponds to a particular predetermined data pattern. For example, when a number of predetermined data patterns each has only an odd weight, a single bit error in a binary codeword results in an odd syndrome. In contrast, two bit errors in a binary codeword can result in an even syndrome. A number of embodiments regarding correcting a single bit error and detecting two bit errors will be further described in detail below.

The following paragraphs describe examples of generating the computed ECC pattern based on the codeword read from the memory, and detecting and correcting a single bit error or detecting two bit errors. Although each of the number of predetermined data patterns is not limited to particular patterns, the number of predetermined data patterns can be analogous to that of the number of predetermined data patterns illustrated in FIG. 3B. Further, the ECC pattern and the data word can be analogous to that of the ECC pattern and the data word illustrated in previous example described in association with FIG. 3B.

In some embodiment, the data word stored in the memory can be erroneous (e.g., due to, but not limited to, read or program disturb) and have a single bit error. For example, the example binary data word previously described in association with FIG. 3B can have a single bit error on data bit 1 as follows:

1 1 1 0 0 0 0 0 0 ... 0 0 0
1 0 1 0 0 0 0 0 0 0 ... 0 0 0, which results in the erroneous data word with two bits having a binary value of 1 and remaining bits having a binary value 0. At step 462, the controller can generate the computed ECC pattern that includes the second number of ECC bits based on the erroneous data word, wherein the controller can first determine the number of predetermined data patterns of each corresponding bit of the erroneous data and generate the computed ECC pattern based on the determined number of predetermined data patterns. In this example, the controller performs the XOR operation on the number of predetermined data patterns of each corresponding data as follows:

| DATA BIT 0: | 0 0 0 0 0 0 0 1 1 1 |
| XOR DATA BIT 2: | 0 0 0 0 0 1 1 1 0 0 |
| | 0 0 0 0 0 1 1 0 1 1 |

The XOR operation will result in the computed ECC pattern of "0 0 0 0 0 1 1 0 1 1" as illustrated above. Upon generating the computed ECC pattern, the controller can perform the XOR operation on the stored ECC pattern read from memory and the computed ECC pattern at step 464. In this example, the controller reads the stored ECC pattern previously written to the memory and performs an XOR operation on it as follows:

| STORED ECC PATTERN: | 0 0 0 0 0 1 0 1 0 1 |
| XOR COMPUTED ECC PATTERN: | 0 0 0 0 0 1 1 0 1 1 |
| | 0 0 0 0 0 0 1 1 1 0 |

At step 465, the controller can determine that the binary codeword read from the memory is erroneous because the syndrome is not zero. Further at step 467, the controller can determine that there is a single bit error within the binary codeword because the syndrome is odd (e.g., having an odd weight). Since the syndrome generated above corresponds to the predetermined data pattern of the data bit 1 of the binary data word, the controller can determine that data bit 1 of the binary data word 1 is erroneous. Since this example illustrates that data bit 1 is erroneous, the syndrome correctly determined the erroneous bit of the codeword. Upon confirming that the syndrome corresponds to one of the number of predetermined data patterns, the controller can correct the error by flipping the data bit 1 (from "0" to "1") at step 470.

In some embodiments, the ECC pattern, instead of the data word, stored in the memory can be erroneous (e.g., due to, but not limited to, read or program disturb) and have a single bit error. In this example, the example ECC pattern previously described in association with FIG. 3B has a single bit error on data bit 1 as follows:

```
          0 0 0 0 0 1 0 1 0 1
          0 1 0 0 0 1 0 1 0 1
```

At step 462, the controller can generate the computed ECC pattern based on the data word, which has no error. Therefore, the computed ECC pattern will be same as that of the stored ECC pattern without the single bit error, wherein the computed ECC pattern will be "0 0 0 0 0 1 0 1 0 1." At step 464, upon generating the computed ECC pattern, the controller can perform the XOR operation on the computed ECC pattern and the erroneous stored ECC pattern. In this example, the syndrome is:

| STORED ECC PATTERN: | 0 1 0 0 0 1 0 1 0 1 |
|---|---|
| XOR COMPUTED ECC PATTERN: | 0 0 0 0 0 1 0 1 0 1 |
| | 0 1 0 0 0 0 0 0 0 0 |

At step 467, the controller can determine that there is a single bit error since the resulting syndrome is an odd syndrome. The controller can determine that the syndrome corresponds to the bit 1 of the ECC pattern pursuant to the number of predetermined data patterns illustrated in FIG. 3B. At step 470, the controller can correct the erroneous bit based on the syndrome generated above.

In some embodiments, the data word stored in the memory can be erroneous (e.g., due to, but not limited to, read or program disturb) and have two bit errors. For example, an example binary data word can have two bit errors on data bit 1 and data bit 3 as follows:

```
          1 1 1 0 0 0 0 0 0 . . . 0 0 0
          1 0 1 1 0 0 0 0 0 . . . 0 0 0,
``` which results in the erroneous data word. At step 462, the controller can generate the computed ECC pattern based on the erroneous data word. In this example, the controller is first configured to determine the number of predetermined data patterns corresponding to each bit of the erroneous data word having a binary value of 1 as follows:

DATA BIT 0: 0 0 0 0 0 0 1 1 1
DATA BIT 2: 0 0 0 0 0 1 1 1 0 0
DATA BIT 3: 0 0 0 0 1 1 1 0 0 0

Upon determining the number of predetermined data patterns, the controller can perform a number of XOR operations on each determined predetermined data patterns at step 464. In this example, the controller performs the XOR operation on the predetermined data patterns corresponding to the bit 0 and bit 2 first as follows:

| DATA BIT 0: | 0 0 0 0 0 0 1 1 1 |
|---|---|
| XOR DATA BIT 2: | 0 0 0 0 0 1 1 1 0 0 |
| | 0 0 0 0 0 1 1 0 1 1 |

Upon performing the XOR operation, the controller can also be configured to perform the XOR operation on the result of the previous XOR operation and the predetermined data pattern corresponding to the bit 3 of the erroneous data word as follows:

| XOR (DATA BIT 0 & DATA BIT 2): | 0 0 0 0 0 1 1 0 1 1 |
|---|---|
| XOR DATA BIT 3: | 0 0 0 0 1 1 1 0 0 0 |
| | 0 0 0 0 1 0 0 0 1 1 |

Upon performing the number of XOR operations, the controller can determine the results of the number of XOR operations to be the computed ECC pattern. Therefore, in this example, the controller determines the computed ECC pattern to be "0 0 0 0 1 0 0 0 1 1." At step 464, the controller can read the stored ECC pattern and perform another XOR operation on the stored ECC pattern and the computed ECC pattern as follows:

| STORED ECC PATTERN: | 0 0 0 0 0 1 0 1 0 1 |
|---|---|
| COMPUTED ECC PATTERN: | 0 0 0 0 1 0 0 0 1 1 |
| | 0 0 0 0 1 1 0 1 1 0 |

At step 467, the controller can determine that the codeword has two bit errors because the syndrome is an even syndrome. The controller can be configured not to correct but alert that there are two bit errors, as illustrated at step 468.

In some embodiments, the stored ECC pattern can have two bit errors. For example, a binary data word can have two bit errors on data bit 1 and data bit 5 as follows:

```
          0 0 0 0 0 1 0 1 0 1
          0 1 0 0 0 0 0 1 0 1
```

At step 462, the controller can generate the computed ECC pattern based on the data word, which has no error. Therefore, the computed ECC pattern will be same as that of the stored ECC pattern, wherein the computed ECC pattern will be: 0 0 0 0 0 1 0 1 0 1. Upon generating the computed ECC pattern, the controller can perform the XOR operation on the computed ECC pattern and the erroneous stored ECC pattern at step 464. The syndrome can be:

| STORED ECC PATTERN: | 0 1 0 0 0 0 0 1 0 1 |
|---|---|
| XOR COMPUTED ECC PATTERN: | 0 0 0 0 0 1 0 1 0 1 |
| | 0 1 0 0 0 1 0 0 0 0 |

At step 467, the controller can determine that the codeword has two bit errors since the syndrome is an even syndrome (e.g., having an even weight). Upon determining that the result does not correspond to any predetermined data pattern, the controller can be configured not to correct but alert that there are two bit errors as illustrated at step 468.

In some embodiments, the stored ECC pattern and the stored data word each can have a single bit error. In this example, an example binary data word can have a single bit error on data bit 1 as follows:

```
1 1 1 0 0 0 0 0 0 ... 0 0 0
1 0 1 0 0 0 0 0 0 ... 0 0 0
```

Further, an example stored ECC pattern illustrated at paragraph [0042] can have a single bit error on data bit 1 as follows:

```
                    0 0 0 0 0 1 0 1 0 1
                    0 1 0 0 0 1 0 1 0 1
```

As illustrated in previous example, the computed ECC pattern generated by the controller at step 462 can be:

| DATA BIT 0: | 0 0 0 0 0 0 0 1 1 1 |
|---|---|
| XOR DATA BIT 2: | 0 0 0 0 0 1 1 1 0 0 |
|  | 0 0 0 0 0 1 1 0 1 1 |

At step 464, upon generating the computed ECC pattern, the controller can perform an XOR operation on the erroneous stored ECC pattern and the computed ECC pattern generated based on the erroneous stored data word. In this example, the syndrome is:

| STORED ECC PATTERN: | 0 1 0 0 0 1 0 1 0 1 |
|---|---|
| COMPUTED ECC PATTERN: | 0 0 0 0 0 1 1 0 1 1 |
|  | 0 1 0 0 1 0 0 1 1 0 |

At step 467, the controller can determine that the binary codeword has two bit errors since the syndrome is an even syndrome. Upon determining that the result does not correspond to any predetermined data pattern, the controller can be configured not to correct but alert that there are two bit errors.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A system, comprising:
   a memory; and
   a controller coupled to the memory and configured to read on a codeword from the memory, wherein the codeword includes:
      user data; and
      a first number of error correction code (ECC) bits that are generated based on an encoding matrix with columns having a first odd weight and a second odd weight to reduce a gap between weights of the columns and maintain a difference between weights of any two adjacent columns of the encoding matrix, wherein an odd weight includes an odd number of bits having a binary value of 1;
   compare the first number of ECC bits to a second number of ECC bits that are generated at least partially based on the codeword read from the memory;
   correct a single error in the codeword in response to a result of the comparison having an odd weight; and
   detect that there are two errors in the codeword in response to a result of the comparison having an even weight.

2. The system of claim 1, wherein every other column starting with a first column of the encoding matrix has the first odd weight and every other column starting with a second column has the second odd weight that is different than the first odd weight.

3. The system of claim 1, wherein the first odd weight and the second odd weight are consecutive odd integers such that a difference between the first odd weight and the second odd weight is 2.

4. The system of claim 1, wherein:
   the encoding matrix comprises a number of data patterns; and
   the controller is configured to identify, in response to the result of the comparison having an odd weight, a bit position of an erroneous bit based on the comparison between the result to the number of data patterns.

5. The system of claim 1, wherein the controller is configured to identify, in response to the result of the comparison having an even weight, that there are two errors in the codeword, while a respective bit position of erroneous bits is unidentifiable.

6. The system of claim 1, wherein the encoding matrix comprises a number of data patterns, wherein each one of the number of data patterns is assigned to each bit position of the codeword.

7. The system of claim 1, wherein the controller is configured to perform, to compare the first number of ECC bits to the second number of ECC bits, an XOR operation on the first number of ECC bits and the second number of ECC bits.

8. A system, comprising:
   a memory; and
   a controller coupled to the memory and configured to:
      generate a first number of error correction code (ECC) bits from user data using an encoding matrix comprising a number of data patterns, wherein:
         columns of the encoding matrix comprise a first odd weight and a second odd weight to reduce a gap between weights of the columns and maintain a difference between weights of any two adjacent columns of the encoding matrix; and
         an odd weight includes an odd number of bits having a binary value of 1 and an even weight includes an even number of bits having a binary value of 1;

write the user data and the first number of ECC bits to the memory;

compare, in response to reading the user data and the first ECC data from the memory, the first number of ECC bits to a second number of ECC bits, wherein the second number of ECC bits are generated from decoding the user data and the first number of ECC bits read from the memory using a decoding matrix comprising at least the number of data patterns;

in response to a result of the comparison having an odd weight that indicates a single error in the user data and the first number of ECC bits, correct the single error; and in response to a result of the comparison having an even weight, detect that there are two errors in the user data and the first number of ECC bits.

9. The system of claim 8, wherein the columns of the encoding matrix has no other weights other than the first weight and the second weight.

10. The system of claim 8, wherein columns of the decoding matrix has a first even weight and a second even weight.

11. The system of claim 10, wherein the first even weight is a consecutive integer of the first odd weight and the second even weight is a consecutive integer of the second odd weight.

12. The system of claim 10, wherein the first even weight and the second even weight are consecutive even integers such that a difference between the first even weight and the second even weight is 2.

13. The system of claim 8, wherein:

the number of data patterns is a first number of data patterns, wherein each one of the first number of data patterns is assigned to a respective bit position of the user data; and the decoding matrix further comprises a second number of data patterns, wherein each one of the second number of data patterns is assigned to a respective bit position of the first number of ECC bits.

14. The system of claim 13, wherein the controller is configured to identify, in response to the result of the comparison having an odd weight, a bit position of an erroneous bit within the user data or the first number of ECC bits based on the comparison of the result of the comparison to the first number of ECC bits or to the second number of ECC bits.

15. The system of claim 13, wherein a quantity of bits of the second number of data patterns is equal to a quantity of bits of the first number of ECC bits.

16. The system of claim 8, wherein the controller is configured to determine there is no error in the codeword in response to a result of the comparison having a zero weight.

17. The system of claim 8, wherein the first weight and the second weight are consecutive odd integers.

18. A method, comprising:

generating a first number of error correction code (ECC) bits based on user data and an encoding matrix, wherein:

columns of the encoding matrix comprise a first odd weight and a second odd weight to reduce a gap between weights of the columns and maintain a difference between weights of any two adjacent columns of the encoding matrix; and an odd weight includes an odd number of bits having a binary value of 1 and an even weight includes an even number of bits having a binary value of 1;

writing a codeword including the user data and the first number of ECC bits to the memory;

generating a second number of ECC bits based at least in part on the user data and the first number of ECC bits read from the memory to compare the first number of ECC bits to the second number of ECC bits;

correcting a single error in the codeword in response to a syndrome corresponding to a result of the comparison having an odd weight; and detecting that there are two errors in the codeword in response to a syndrome corresponding to a result of the comparison having an even weight.

19. The method of claim 18, wherein generating the first number of ECC bits based on user data and an encoding matrix further comprises performing a number of XOR operations on the user data and the encoding matrix, wherein a quantity of the number of XOR operations performed is proportional to a quantity of bits having a binary value of 1 of the user data.

20. The method of claim 18, wherein the method further comprises performing, to compare the first number of ECC bits to the second number of ECC bits, a number of XOR operation on the first number of ECC bits and a second number of ECC bits.

* * * * *